United States Patent [19]
Burgess et al.

[11] Patent Number: 5,777,487
[45] Date of Patent: Jul. 7, 1998

[54] METHOD FOR DETECTING FAILURES IN ELECTRIC CIRCUITS AND TESTER, LIQUID CRYSTAL FOR USE THEREWITH

[76] Inventors: David L. Burgess, 470 Laurel Ave., Half Moon Bay, Calif. 94019; Orlin D. Trapp, 51 Hillbrook Dr., Portola Valley, Calif. 94028

[21] Appl. No.: 641,958

[22] Filed: May 2, 1996

[51] Int. Cl.$^6$ .................................................. G01R 31/26
[52] U.S. Cl. ................................................... 324/765
[58] Field of Search .............................. 324/756, 158, 324/765

[56] References Cited

U.S. PATENT DOCUMENTS

| | | | |
|---|---|---|---|
| 4,618,819 | 10/1986 | Mourou et al. | 324/77 |
| 4,682,857 | 7/1987 | Tan | 359/86 |
| 5,272,434 | 12/1993 | Meyrueix et al. | 324/158 |

OTHER PUBLICATIONS

G.J. West, A Simple Technique for Analysis of ESD Failures of Dynamic Rams Using Liquid Crystals (1982) IEEE/Proc., pp. 185–187. (Month unavailable).

Burgess, et al., Improved Sensitivity for Hot Spot Detection Using Liquid Crystals (1984) IEEE/IRPS, pp. 119–121. (Month unavailable).

Technology Associates, Liquid Crystal Hot Spot Detection Kit 4300 Procedure (May 30, 1985) pp. 1–14.

O.D. Trapp, Liquid Crystal Hot Spot Detection Kit 4300 Procedure, Part Number 4304 (Mar. 31, 1988, Revised) pp. 1–18.

John Hiatt; "A Method of Detecting Hot Spots on Semiconductors Using Liquid Crystal"; IEEE/Proc. IRPS; Jun. 1981; pp. 130–133.

*Primary Examiner*—Ernest F. Karlsen
*Assistant Examiner*—Anh Phung
*Attorney, Agent, or Firm*—Flehr Hohbach Test Albritton & Herbert LLP

[57] ABSTRACT

A method for detecting a failure in an electronic device having an electric circuit. The method includes the steps of coating the electric circuit with a liquid crystal having a transition temperature between nematic and isotropic phases. A voltage is applied across the electric circuit so that the temperature of the liquid crystal at the failure approximates the transition temperature of the liquid crystal. The voltage applied is cycled across the electric circuit between a first nonzero voltage which is greater than the transition temperature and a second nonzero voltage which is less than the transition temperature. The cycling of the voltage reduces transient optical effects in the liquid crystal which have an appearance similar to the isotropic phase of the liquid crystal. A tester and liquid crystal for use in the method are provided.

23 Claims, 2 Drawing Sheets

METHOD FOR DETECTING FAILURES IN ELECTRIC CIRCUITS AND TESTER, LIQUID CRYSTAL FOR USE THEREWITH

This invention relates to methods for detecting failures of electric circuits and more specifically to methods which utilize liquid crystals for detecting hot spots on the surface of electric circuits.

Failure modes in electric circuits such as integrated circuits are often accompanied by a change in leakage current or power dissipation which results in a localization of heat at the area of the defect on the electric circuit. Liquid crystals are currently utilized for detecting these failures by locating the associated hot spot on the electric circuit when power is supplied to the defect. In a typical failure analysis procedure using liquid crystals, the circuit or device being tested is coated with a thin layer of liquid crystal and then cyclically biased with a voltage which is sufficient to raise the temperature of the liquid crystal above its clearing point at the hot spot when current is flowing through the circuit. Below the clearing point or transition temperature, when the liquid crystal is in its nematic phase, its appearance is mottled when viewed through cross polarizing filters. Above the clearing point, when the liquid crystal is in its isotropic phase, it appears dark when viewed through cross polarizing filters. The cyclical biasing causes the hot spot to blink at the frequency of the input voltage wave and thus facilitates location of the hot spot.

Unfortunately, this currently used technique suffers from a number of disadvantages. Each time the electric field anywhere in the circuit varies through a threshold value due to the cycling of the input voltage, the molecules of the liquid crystal change from one orientation to another. This molecular motion results in transient optical effects which have an appearance similar to the isotropic phase of the liquid crystal at the point of current leakage or power dissipation. These voltage induced transient optical effects can thus be confused with hot spot activity. There is, therefore, a need for a new and improved method for detecting failures in electric circuits which overcomes these disadvantages.

It is in general an object of the invention to provide a method and tester for detecting failures in electric circuits by the use of a liquid crystal.

Another object of the invention is to provide a method and tester of the above character which reduce voltage induced transient optical effects in the liquid crystal that can be confused with hot spot activity.

Another object of the invention is to provide a method and tester of the above character which oscillate the voltage being applied across the electric circuit between two nonzero values.

Another object of the invention is to provide a method and tester of the above character which oscillate the voltage being applied to the electric circuit within a relatively narrow range so as to minimize changes in electric fields experienced by the electric circuit.

Another object of the invention is to provide a method and tester of the above character which utilize a liquid crystal having a clearing point relatively close to room temperature.

Additional objects and features of the invention will appear from the following description from which the preferred embodiments are set forth in detail in conjunction with the accompanying drawings.

In general, a method for detecting a failure in an electronic device having an electric circuit is provided. The method includes the steps of coating the electric circuit with a liquid crystal having a transition temperature between nematic and isotropic phases. A voltage is applied across the electric circuit so that the temperature of the liquid crystal at the failure approximates the transition temperature of the liquid crystal. The voltage applied is cycled across the electric circuit between a first nonzero voltage which is greater than the transition temperature and a second nonzero voltage which is less than the transition temperature. The cycling of the voltage reduces transient optical effects in the liquid crystal which have an appearance similar to the isotropic phase of the liquid crystal. A tester and liquid crystal for use in the method are provided.

Figure 1:
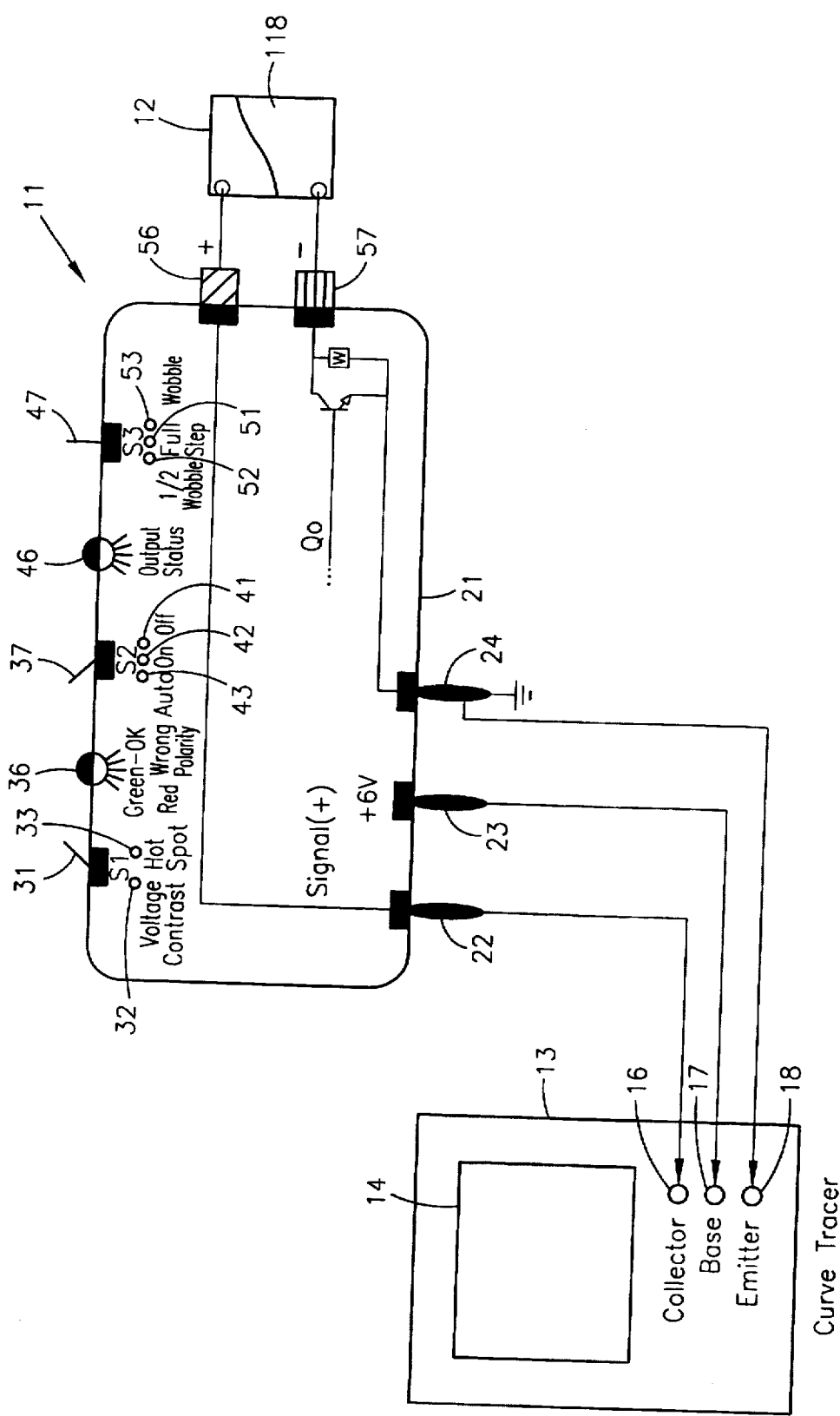
FIG. 1 is a top plan view of a tester for detecting failures in electric circuits of the present invention coupled to a power source.

More in particular, the apparatus or tester 11 of the present invention, shown in FIG. 1, is used for detecting failures in electric circuits such as an integrated circuit 12 or a discrete transistor embedded in a semiconductor. It should be appreciated, however, that tester 11 can be used for detecting failures in other devices such as printed circuit boards or passive devices such as resistor arrays and be within the scope of the present invention. Tester 11 is utilized with any suitable power supply such as a conventional curve tracer 13 having a screen 14 for displaying the current passing through the device under test as a function of the voltage being applied to the device. Curve tracer 13 further includes a collector terminal 16, a base terminal 17 and an emitter or ground terminal 18. Tester 11 is formed from a housing 21 having at least one power terminal and two power terminals in the form of collector prong 22 and base prong 23. Housing 21 further includes a ground terminal in the form of emitter prong 24. Prongs 22, 23 and 24 are adapted for electrical connection to terminals 16, 17 and 18 of curve tracer 13. More specifically, terminals 16, 17 and 18 can be in the form of sockets for respectively receiving prongs 22, 23 and 24.

Housing 21 includes a plurality of switches and indicator lights for use in the operation thereof. First switch means or switch S1 or 31 is a toggle switch having a VOLTAGE CONTRAST position 32 and a HOT SPOT position 33. A first indicator light 36 is provided which can emit either green or red light. Second switch means or switch S2 or 37 is a tri-position toggle switch having an OFF position 41, an ON position 42 and an AUTO position 43. A second indicator light 46 and a third switch means in the form of switch S3 or 47 are also provided. Switch 47 is a tri-position toggle switch having a FULL STOP position 51, a ½ WOBBLE position 52 and a full WOBBLE position 53. Housing 21 of tester 11 further includes at least one and, as shown in FIG. 1, first and second test terminals or probes 56 and 57. First test terminal 56 is adapted for electrical connection to input terminal 58 of integrated circuit 12 and second test terminal 57 is adapted for electrical connection to output terminal 59 of integrated circuit 12.

Figure 2:
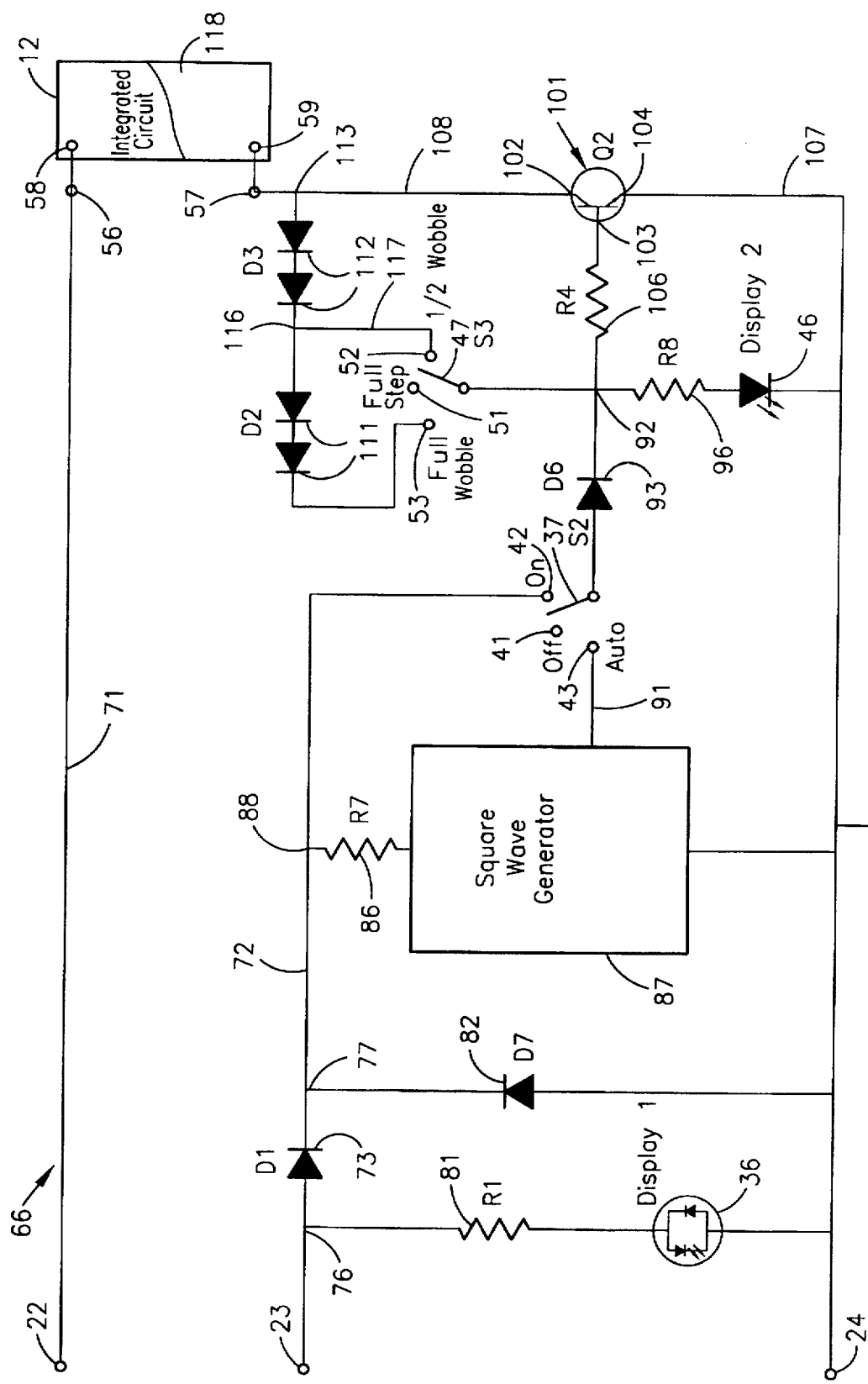
FIG. 2 is a circuit diagram of the electrical circuitry within the tester of FIG. 1.

Electrical circuitry 66 is carried within housing 21 as shown in FIG. 2 of the drawings. As shown therein, collector prong 22 is electrically connected to first test terminal 56 by printed circuit board trace or wire 71. Base prong 23 is electrically connected to ON terminal 42 of switch 37 by means of printed circuit board trace or wire 72. A directional diode D1 or 73 is provided on wire 72 between junctions or nodes 76 and 77 for permitting current to travel from node 76 to node 77 but not vice-versa. Resistor R1 or 81 is connected in series with first indicator light 36 between node 76 and emitter prong 24. The first indicator light 36, identified in FIG. 2 as Display 1, can be in the form of a light emitting diode or LED display which contains a green light emitting diode in one direction and a red light emitting diode in the other direction. A directional diode D7 or 82 is electrically coupled in parallel with resistor 81 and display 36 between node 77 and emitter prong 24 and precludes the flow of current from the node 77 to ground. A resistor R7 or 86 and a conventional square generator 87 are electrically coupled in series between a junction or node 88 provided on wire 72 and ground. Lead means in the form of printed circuit board trace or wire 91 electrically connects square wave generator 87 to the AUTO terminal 43 of switch 37.

Switch 37 is electrically connected to a junction or node 92 by means of directional diode D6 or 93 which permits the flow of current from the switch 37 to the node 92. A resistor R8 or 96 extends in series with second indicator light 46 between node 92 and ground 24. Indicator light 46, shown as Display 2 in FIG. 2, can be in the form of an LED. Electrical circuitry 66 further includes an npn transistor Q2 or 101 having a collector 102, base 103 and emitter 104. A resistor R4 or 106 extends between node 92 and base 103 of transistor 101. Emitter terminal 104 of the transistor 101 is coupled to ground 24 by means of printed circuit board trace or wire 107, while collector 102 of the transistor 101 is electrically coupled to second test terminal 57 by means of printed circuit board trace or wire 108.

Transistor 101 is included within the cycling means of electrical circuitry 66 for providing a voltage across integrated circuit 12 which cycles between first and second non-zero voltages. This cycling means has means for selectively biasing transistor 101 which includes two directional diodes D2 or 111 and two additional directional diodes D3 or 112. The two diodes 112 extend in series from a junction or node 113 provided on wire 108 to a junction or node 116 connected to ½ WOBBLE terminal 52 by means of lead means or printed circuit board trace or wire 117. The two directional diodes 111 extend in series from node 116 to full WOBBLE terminal 53 of switch 47. When switch 47 is in its ½ WOBBLE position in contact with terminal 52, the two diodes 112 provide a voltage drop of approximately 1.4 volts between node 113 and ½ WOBBLE terminal 52. When switch 47 is in its full WOBBLE position in contact with terminal 53, the two diodes 112 in series with the two diodes 111 provide for an aggregate voltage drop of approximately 2.8 volts, 1.4 volts across diodes 112 and 1.4 across diodes 111, between node 113 and full WOBBLE terminal 53. It should be appreciated that a reverse bias diode could be used in place of either diodes 111 and/or 112 and be within the scope of the present invention.

Liquid crystal 118 in the form of a chemical of E. Merck Darmstadt of Germany and having a trade name PTP-47 can be used in the method and process of the present invention. The chemical formula for PTP-47 is as follows:

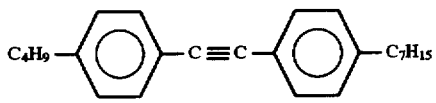

The chemical name for PTP-47 is: 4-n-Butyl-4'-n-Heptyldiphenyl Acetylene PTP-47 has a clearing point or transition temperature of approximately 24.8 degrees Celsius and an optical anisotropy of approximately 0.202.

In operation and use, tester 11 is coupled to curve tracer 13 in the manner discussed above and as illustrated in FIG. 1. Integrated circuit 12 is, in turn, connected to tester 11 by electrically connecting first test terminal 56 of the tester to input terminal 58 of the integrated circuit and connecting second test terminal 57 of the tester to output terminal 59 of the integrated circuit. Integrated circuit 12 is decapsulated to expose the semiconductor surface. If particles or residue are present on the semiconductor surface, the surface should be cleaned by any suitable means such as by use of an ultrasonic cleaning solution concentrate. A thin coat of liquid crystal 118 is applied to the surface of the integrated circuit 12. Spreading strips can be used to spread and thin out the liquid crystal to a thickness of approximately a few microns, which is less than the height of a typical ball bond. Integrated circuit 12 is then viewed through a metallurgical microscope set up with cross polarizing filters. Surfaces without any liquid crystal 118, or with nematic liquid crystal at a temperature above the clearing point or transition temperature of the liquid crystal, will be very dark in appearance. Surfaces with liquid crystal 118 below the clearing point will be lighter and mottled in appearance.

For activating tester 11, a suitable power such as 6 volts is applied to base prong or terminal 23 of the tester by curve tracer 13. With switch 31 in its HOT SPOT position 33 and tester 11 properly biased between base terminal 23 and emitter terminal 24 with a positive voltage, light emitting diode 36 displays a green light to indicate that the tester 11 is in operational condition. If a negative voltage is inadvertently applied by the base power supply, light emitting diode 36 displays a red light to indicate to the operator that electrical circuitry 66 has been improperly biased. Resistor 81 serves to limit the current available to display 36. Directional diode 73 precludes current from being pulled backwards through circuitry 66 if, for example, a negative voltage has been applied to base terminal 23. Directional diode 82 serves as a voltage regulator for electrical circuitry 66 and permits the operator to apply anywhere from approximately 4 to 10 volts and still provide a proper voltage of approximately 5 volts to square wave generator 87.

Integrated circuit 12 is now biased in its failing mode by supplying an input voltage to collector prong 22 and circuit terminal 58 to determine the location of the defect on the surface of the integrated circuit. This input voltage can range from approximately 5 to 100 volts. Transistor 101 serves as a switch which remains in an OFF position when switch 37 is in an OFF position and switch 47 is in its FULL STEP position 51. In this regard, transistor 101 blocks up to 100 volts when in its OFF position. As a result, the voltage drop across integrated circuit terminals 58 and 59 is zero and no current flows through integrated circuit 12 when switch 37 is in its OFF position 41.

When switch 37 is moved to its ON position 42, current from base terminal 23 is permitted to flow to the base 103 of transistor 101 producing approximately 0.1 volt at transistor collector 102. The transistor is thus fully open to form a short between wires 108 and 107. Diode 82 further serves to regulate the voltage to transistor 101. The accompanying voltage drop across the integrated circuit causes current to flow through the integrated circuit to ground 24. External heating due to abnormal current flow through integrated circuit 12 causes the localized area at the defect to become a hot spot and darken as the temperature of liquid crystal 118 is raised above its clearing point. The hot spot will grow or shrink in relation to the current being applied to integrated circuit 12 through terminal 58 once the temperature of the liquid crystal at the defect exceeds the clearing point. The current flowing from switch 37 is shared by transistor 101 and LED 46, with the voltage at node 92 being approximately 0.7 volts. In this manner, LED 46 is turned on when transistor 101 is in its full ON position. Resistor 106 serves to control the current into transistor 101 and resistor 96 serves to control the current into display 46. The resistors 106 and 96 are selected to divide the current as required by transistor 101 and display 46.

Movement of switch 37 to its AUTO position 43 serves to engage square wave generator 87 which provides a square wave of approximately 5 volts at a frequency of approximately two hertz to transistor 101. Resistor 86 serves to control the current into square wave generator 87 and directional diode 93 prevents any current from flowing backwards from transistor 101 or display 46 into the square wave generator 87. The square wave generator is thus included with the electrical means of tester 11 for switching transistor 101 ON and OFF at a predetermined frequency of approximately two hertz. This periodic activation of the transistor 101 serves to permit only intermittent flow of current through integrated circuit 12 when switch 47 is in the FULL STEP position 51. The voltage across integrated circuit 12 and the accompanying current traveling through the integrated circuit thereby cycles between a predetermined value and zero when switch 37 is in its AUTO position 42. Since liquid crystal 118 is heated to its transition temperature within approximately one millisecond after power is supplied to integrated circuit 12, which heating period is within the half second duty cycle of transistor 101, the hot spot on integrated circuit 12 blinks with the frequency of the output current of square wave generator 87.

Movement of switch 47 to either its ½ WOBBLE position 52 or full WOBBLE position 53 when switch 37 is in its AUTO position 43 serves to wobble or cycle the voltage across integrated circuit 12 and the current traveling through the integrated circuit between first and second non-zero values. For example, the movement of switch 47 to its ½ WOBBLE position 52 causes diodes 112 to be electrically coupled between collector 102 and base 103 of transistor 101 so as to provide a self-biasing transistor at the output of integrated circuit 12. Thus, when square wave generator 87 is in its high position providing a positive current, transistor 101 becomes saturated so as to be in a full ON position forming a short between node 113 and ground. Although the voltage potential is higher at node 92 than at node 113, directional diodes 112 preclude the flow of current therebetween. Accordingly, diodes 112 have no effect in circuitry 66 when square wave generator 87 is in its high position and integrated circuit 12 thus sees the full voltage from curve tracer collector 16 across its input and output terminals 58 and 59.

When square wave generator 87 is in its low position, no current is provided therefrom to transistor 101. Since the transistor 101 is no longer shorted between collector 102 and emitter 104, current from terminal 57 is encouraged to flow from integrated circuit 12 through diodes 112 to ground 24 and transistor base 103. Diode 93 precludes the current through diodes 112 and/or 111 and switch 47 from flowing back into square wave generator 87. The only current now biasing transistor 101 is the current from the device under test. As this current biases the transistor to a partially ON condition, the voltage at collector 102 is lowered until the biasing current to transistor base 103 is reduced and the voltage at collector thereby increased again. As can be seen, transistor 101 cannot be saturated when switch 47 is in its ½ WOBBLE position 52. When the current from node 92 to transistor 101 reaches equilibrium with the current from node 113 to the transistor, the voltage drop is approximately 1.4 volts between nodes 113 and 92 and approximately 0.6 volt between node 92 and ground. Thus, the voltage at node 113 and across transistor 101 is approximately 2 volts.

As can be seen, switch 47 and diodes 112 cause the voltage seen by integrated circuit 12 to wobble or cycle at a frequency of approximately two hertz between a first voltage equal to the voltage being applied at input terminal 58 and a second voltage equal to this applied voltage less approximately 2 volts. Diodes 112 serve to bias transistor 101 when switch 47 is in its ½ WOBBLE position and cause the transistor to act in an intermediate ON position. In this manner, transistor 101 provides a positive voltage at output terminal 59 when square wave generator 87 is supplying zero current to the transistor. This voltage at output terminal 59 is less than the input voltage being supplied to input terminal 58 by curve tracer 13.

In a similar manner, movement of switch 47 to its WOBBLE position 53 causes the voltage applied across integrated circuit 12 to wobble or cycle between a first voltage equal to the voltage applied across input and output terminals 58 and 59 of the integrated circuit and a second voltage equal to that applied voltage less the voltage drop of approximately 2.8 volts across diodes 112 and 111 and approximately 0.6 volts between node 92 and ground. As can be seen, the voltage at node 113 is approximately 3.4 volts when square wave generator 87 is in its low position and transistor 101 thus in its self-biased intermediate ON position.

The wobbling or cycling of the voltage being applied across integrated circuit 12 facilitates the location of hot spots thereon. The input voltage supplied to input terminal 58 of the integrated circuit is adjusted so that when integrated circuit 12 sees this full voltage, the localized liquid crystal 118 at the defect on integrated circuit 12 is elevated to a temperature above the transition temperature of the liquid crystal. The cyclical reduction by approximately 2 to 3.4 volts of the voltage applied across the integrated circuit 12 causes the temperature of liquid crystal 118 at the defect to drop below the transition temperature during this voltage reduction. In this manner, the localized liquid crystal 118 at the defect changes between its nematic and isotropic phases at a frequency approximating the output signal of square wave generator 87. Since the voltage applied across integrated circuit 12 does not drop to zero when square wave generator 87 is supplying zero current to transistor 101, the cyclical changes in the electrical fields within integrated circuit 12 are reduced and the associated transient optical effects of liquid crystal 118 are minimized if not eliminated. As such, the blinking hot spots on the surface of integrated circuit 12 are more pronounced because the remainder of liquid crystal 118 is not changing appearance in unison with the hot spot.

Although the cyclical reduction of the voltage being across device 12 has been described as being either approximately 2 volts or approximately 3.4 volts, it should be appreciated that such a reduction ranging from 0.5 to 5 volts can be provided and be within the scope of the present invention.

It should be appreciated that external heating sources such as a resistor disposed adjacent integrated circuit 12, a focused incandescent lamp, a heat gun or any other conventional means can be used to heat integrated circuit 12 and liquid crystal 118 to a temperature which approximates but is below the transition temperature of the liquid crystal. Any effort expended to heat integrated circuit 12 for liquid crystal analysis will be repaid by extending the low power limit for detectable defects. Optimally, temperature control should achieve a sample temperature of approximately 0.1 degree Celsius or less below the clearing point of liquid crystal 118.

The utilization of PTP-47 is highly desirable because the clearing point of this liquid crystal is very close to room temperature. As such, the applied voltage to integrated circuit 12 and the heat required to cause the detectable phase change in the liquid crystal is reduced. External heating may not be required when PTP-47 is used as liquid crystal 118. PTP-47 is also desirable because of its relatively high optical anisotropy which provides a relatively sharp and distinct change between nematic and isotropic phases. A dramatic difference in the optical properties of a liquid crystal above and below its clearing point are advantageous in hot spot detection. Accordingly, this high optical anisotropy of PTP-47 facilitates easy detection of any hot spots on integrated circuit 12. It should be appreciated, however, that other conventional liquid crystals can be utilized and be within the scope of the present invention.

In view of the foregoing, it can be seen that a new and improved method and tester have been provided for detecting failures in electrical circuits by the use of liquid crystals. The method and tester reduce transient optical effects in the liquid crystal which can be confused with hot spot activity. The voltage applied across the electric circuit is oscillated between two non-zero values and, more specifically, is oscillated within a relatively narrow voltage range so as to minimize changes in electric fields experienced by the electric circuit. The method and tester can utilize a liquid crystal having a clearing point relatively close to room temperature.

What is claimed is:

1. A method for detecting a failure in an electronic device having an electric circuit therein comprising coating the electric circuit with a liquid crystal having a transition temperature between nematic and isotropic phases, applying a voltage across the electric circuit so that the temperature of the liquid crystal at the failure approximates the transition temperature of the liquid crystal and cycling the voltage being applied across the electric circuit between a first nonzero voltage which causes the liquid crystal at the failure to have a temperature that is greater than the transition temperature and a second nonzero voltage which causes the liquid crystal at the failure to have a temperature that is less than the transition temperature whereby said cycling of the voltage reduces transient optical effects in the liquid crystal which have an appearance similar to the isotropic phase of the liquid crystal.

2. A method as in claim 1 wherein the applying step includes applying a voltage across the electric circuit so that the temperature of the liquid crystal at the failure is greater than the transition temperature of the liquid crystal.

3. A method as in claim 1 wherein the cycling step includes cycling the voltage being applied across the electric circuit between a first nonzero voltage which is approximately 3.4 volts more than the second nonzero voltage.

4. A method as in claim 1 wherein the cycling step includes cycling the voltage being applied across the electric circuit between a first nonzero voltage which is approximately two volts more than the second nonzero voltage.

5. A method as in claim 1 further comprising the step of externally heating the liquid crystal to a temperature which approximates the transition temperature of the liquid crystal prior to the cycling step.

6. A method as in claim 1 wherein the liquid crystal is the liquid crystal having the trade name PTP-47.

7. A tester for use with a power supply to detect a failure in an electric circuit coated with a liquid crystal having a transition temperature between nematic and isotropic phases, comprising electrical circuitry, at least one power terminal in electrical contact with the circuitry adapted for electrical connection with the power supply, at least one test terminal in electrical contact with the circuitry adapted for electrical connection with the electric circuit, the electrical circuitry including means for applying a voltage across the electric circuit which cycles between a first nonzero voltage for heating the liquid crystal at the failure to a first temperature which is greater than the transition temperature of the liquid crystal and a second nonzero voltage for permitting the liquid crystal at the failure to approximate a second temperature which is less than the transition temperature.

8. A tester as in claim 7 wherein said applying means cycles the voltage between a first nonzero voltage which ranges from approximately 0.5 to 5.0 volts greater than the second nonzero voltage.

9. A tester as in claim 7 wherein said applying means cycles the voltage between a first nonzero voltage which is approximately two volts greater than the second nonzero voltage.

10. A tester as in claim 7 wherein said applying means cycles the voltage between a first nonzero voltage which is approximately 3.4 volts greater than the second nonzero voltage.

11. A tester as in claim 7 wherein said applying means includes a transistor.

12. A tester as in claim 11 wherein said applying means includes means for biasing the transistor coupled between the collector and base of the transistor.

13. A tester as in claim 12 wherein said biasing means includes at least one diode.

14. A tester for detecting a failure in an integrated circuit having input and output terminals and coated with a liquid crystal having a transition temperature between nematic and isotropic phases, comprising electrical circuitry having a first test terminal adapted for electrical connection with the input terminal of the integrated circuit for providing an input voltage to the integrated circuit, a second test terminal adapted for electrical connection with the output terminal of the integrated circuit and an additional terminal adapted for electrical connection with ground, the electrical circuitry including a transistor electrically coupled between the second test terminal and the additional terminal, means for biasing the transistor coupled between the collector and the base of the transistor and a square wave generator electrically coupled to the base of the transistor for cycling the voltage applied between the input and output terminals of the integrated circuit between a first nonzero voltage for heating the liquid crystal at the failure to a first temperature which is greater than the transition temperature of the liquid crystal and a second nonzero voltage for permitting the liquid crystal at the failure to approximate a second temperature which is less than the transition temperature.

15. A tester as in claim 14 wherein the biasing means includes at least one diode.

16. A tester as in claim 15 wherein the biasing means includes first and second diodes coupled at a junction so as to be in series.

17. A tester as in claim 16 wherein the biasing means includes a switch having a first position coupled to the junction so that the voltage potential between the collector and base includes the voltage drop across only the first diode and a second position so that the voltage potential between the collector and base includes the voltage drop across both of the first and second diodes.

18. A method for detecting a failure in an electronic device having an electric circuit therein comprising coating the electric circuit with a liquid crystal an intermediate phase between liquid and solid and an isotropic phase and having a transition temperature between said phases, applying a voltage across the electric circuit so that the temperature of the liquid crystal at the failure approximates the transition temperature of the liquid crystal and cycling the voltage being applied across the electric circuit between a first nonzero voltage which causes the liquid crystal at the failure to have a temperature that is greater than the transition temperature and a second nonzero voltage which [causes] permits the liquid crystal at the failure to have a temperature that is less than the transition temperature whereby said cycling of the voltage reduces transient optical effects in the liquid crystal which have an appearance similar to the isotropic phase of the liquid crystal.

19. A method as in claim 18 wherein the applying step includes applying a voltage across the electric circuit so that the temperature of the liquid crystal at the failure is greater than the transition temperature of the liquid crystal.

20. A method for detecting a failure in an electronic device having an electric circuit therein comprising coating the electric circuit with a liquid crystal having an intermediate phase between liquid and solid and an isotropic phase and having a transition temperature between said phases and cycling a voltage across the electric circuit between a first voltage which causes the liquid crystal at the failure to have a temperature that is greater than the transition temperature and a second voltage which permits the liquid crystal at the failure to have a temperature that is less than the transition temperature whereby said cycling of the voltage reduces transient optical effects in the liquid crystal which have an appearance similar to the isotropic phase of the liquid crystal.

21. A method as in claim 20 wherein the coating step includes coating the electric circuit with a liquid crystal having a transition temperature between nematic and isotropic phases.

22. A method as in claim 20 further comprising the step of raising the temperature of the liquid crystal at the failure to approximate the transition temperature of the liquid crystal.

23. A method as in claim 20 wherein the liquid crystal is the liquid crystal 4-n-Butyl-4'-n-Heptyldiphenyl Acetylene.

* * * * *